US 8,844,546 B2

(12) United States Patent
Chen et al.

(10) Patent No.: US 8,844,546 B2
(45) Date of Patent: Sep. 30, 2014

(54) APPARATUS AND METHOD FOR CLEANING SEMICONDUCTOR SUBSTRATE USING PRESSURIZED FLUID

(75) Inventors: Hui (Fred) Chen, Burlingame, CA (US); Allen L. D'Ambra, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 132 days.

(21) Appl. No.: 12/243,685

(22) Filed: Oct. 1, 2008

(65) Prior Publication Data

US 2010/0078044 A1  Apr. 1, 2010

(51) Int. Cl.
*B08B 3/00* (2006.01)
*H01L 21/67* (2006.01)

(52) U.S. Cl.
CPC .................. *H01L 21/67051* (2013.01)
USPC ........................................ 134/144

(58) Field of Classification Search
USPC .......... 134/1.3, 88, 94.1, 95.3, 144, 137, 151, 134/153, 154, 902
See application file for complete search history.

(56) References Cited

U.S. PATENT DOCUMENTS

| | | | |
|---|---|---|---|
| 2,186,600 A * | 1/1940 | Behrens | 206/210 |
| 5,855,681 A * | 1/1999 | Maydan et al. | 118/719 |
| 6,033,522 A * | 3/2000 | Iwata et al. | 156/345.12 |
| 6,119,708 A | 9/2000 | Fishkin et al. | |
| 6,230,753 B1 * | 5/2001 | Jones et al. | 134/1.3 |
| 6,516,816 B1 | 2/2003 | Husain et al. | |
| 6,558,471 B2 * | 5/2003 | Brown et al. | 134/6 |
| 6,560,809 B1 | 5/2003 | Atoh | |
| 6,577,382 B2 * | 6/2003 | Kida et al. | 355/77 |
| 6,643,882 B1 * | 11/2003 | Sotozaki et al. | 15/77 |
| 6,851,152 B2 * | 2/2005 | Sotozaki et al. | 15/88.3 |
| 2002/0121289 A1 * | 9/2002 | Brown et al. | 134/6 |
| 2002/0189641 A1 | 12/2002 | Sato | |
| 2003/0200988 A1 | 10/2003 | Brown et al. | |
| 2005/0211276 A1 * | 9/2005 | Yudovsky et al. | 134/42 |
| 2006/0174919 A1 | 8/2006 | Randhawa | |
| 2006/0277702 A1 * | 12/2006 | Lin et al. | 15/77 |
| 2007/0119476 A1 | 5/2007 | Hara et al. | |
| 2007/0141849 A1 | 6/2007 | Kanno et al. | |
| 2008/0038481 A1 | 2/2008 | West et al. | |
| 2008/0190451 A1 | 8/2008 | Goto | |

FOREIGN PATENT DOCUMENTS

| | | |
|---|---|---|
| JP | 62173718 | 7/1987 |
| JP | 06310485 A | 11/1994 |
| JP | 10189528 A | 7/1998 |
| JP | 10289889 A | 10/1998 |

(Continued)

OTHER PUBLICATIONS

International Search Report and Written Opinion dated Mar. 30, 2010 for International Application No. PCT/US2009/056679.

(Continued)

*Primary Examiner* — David Cormier
(74) *Attorney, Agent, or Firm* — Patterson & Sheridan, LLP

(57) ABSTRACT

Embodiments of the present invention generally relate to an apparatus and a method for cleaning a semiconductor substrate after a polishing process. Particularly, embodiments of the present invention relates to an apparatus and method for cleaning a substrate using pressurized fluid. One embodiment of the present invention comprises two rollers to support and rotate a substrate in a substantially vertical orientation, a pressure wheel to apply a force to engage the substrate with the two rollers, and a swinging nozzle configured to dispense a pressurized fluid towards the substrate.

21 Claims, 6 Drawing Sheets

(56) References Cited

FOREIGN PATENT DOCUMENTS

| | | |
|---|---|---|
| JP | 2001007068 A | 1/2001 |
| JP | 2001007069 A | 1/2001 |
| JP | 2002151454 A | 5/2002 |
| JP | 2002164318 A | 6/2002 |
| JP | 2005142309 A | 6/2005 |

OTHER PUBLICATIONS

Japanese Office Action (with attached English translation) for Patent Application No. 2011-530090 dated Oct. 18, 2013; 6 pages.

* cited by examiner

APPARATUS AND METHOD FOR CLEANING SEMICONDUCTOR SUBSTRATE USING PRESSURIZED FLUID

BACKGROUND OF THE INVENTION

1. Field of the Invention

Embodiments of the present invention generally relate to an apparatus and a method for processing semiconductor substrates. More particularly, embodiments of the present invention provide apparatus and method for cleaning semiconductor substrates.

2. Description of the Related Art

During fabrication of a semiconductor device, various layers, such as oxides, copper, require planarization to remove steps or undulations prior to formation of subsequent layers. Planarization is typically performed mechanically, chemically, and/or electrically by pressing a device side of a semiconductor substrate against a polishing pad which is saturated with a polishing solution, such as an abrasive compound, and by rotating the polishing pad relative to the semiconductor substrate. Multiple steps of polishing are generally performed using different polishing pads and polishing solutions to achieve desired flatness and smoothness on the device side.

The planarization process is generally followed by a cleaning process which removes residual of the polishing solutions and/or particles from polishing. Conventional cleaning processes generally include scrubbing the substrate surfaces with mechanical scrubbing devices using brushes made from porous or sponge like materials, such as polyvinyl acetate (PVA), or brushes made with nylon bristles. Additionally, one or more nozzles that output sonically energized fluid may be used in combination with the brushes. Scrubbing and spraying may remove majority of residual polishing solution and other particles on the substrate surfaces. However, conventional cleaning processes usually fail to remove particles in deep trench of a patterned substrate and the substrates are also susceptible to damages caused by conventional cleaning.

Therefore, there is a need for an apparatus and method to remove particles in deep trenches of a substrate surface and to reduce damages during cleaning.

SUMMARY OF THE INVENTION

The present invention generally relates to a method and apparatus for cleaning a substrate after a polishing process. Particularly, embodiments of the present invention relate to an apparatus and method for cleaning a substrate using pressurized fluid.

One embodiment provides a substrate cleaner comprising a chamber body defining a processing volume, two rollers disposed in the processing volume, wherein each of the rollers has a grove configured to receive an edge of a substrate, and the two rollers are configured to support a substrate in a substantially vertical orientation and to rotate the substrate, and a nozzle movably disposed in the processing volume, wherein the nozzle is configured to move parallel to the substrate and to direct a pressurized fluid towards one or more regions of the substrate.

Another embodiment provides a substrate cleaner comprising a chamber body defining a processing volume configured to house a substrate in a substantially vertical orientation, wherein the chamber body has a top opening configured to allow passage of the substrate, first and second rollers disposed in a lower portion of the processing volume, wherein each of the first and second rollers has a grove configured to receive an edge of the substrate, and the first and second rollers are configured to rotate the substrate in the substantially vertical orientation, a pressure wheel disposed in an upper portion of the processing volume, wherein the pressure wheel is movable between a retracted position configured to clear a passage for the substrate and an extended position configured to retain the substrate, the pressure wheel is configured to apply a force on the edge of the substrate to push the substrate against the first and second rollers to engage substrate with the first and second rollers, and a swing nozzle coupled to a pivoting arm disposed in the processing volume, wherein the swing nozzle is configured to swing parallel to the substrate and to direct a pressurized fluid towards one or more regions of the substrate.

Yet another embodiment provides a method for cleaning a semiconductor substrate comprising positioning a substrate on first and second rollers, wherein the first and second rollers are configured to support the substrate and rotate the substrate in a substantially vertical orientation, engaging the substrate with the first and second rollers by applying a force to an edge of the substrate by a pressure wheel, rotating the first and second rollers to rotate the substrate, and cleaning the substrate by directing a pressurized fluid toward the substrate from a spraying nozzle while swing the spraying nozzle across a radius of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to an apparatus and a method for cleaning a semiconductor substrate after a polishing process. Particularly, embodiments of the present invention relate to an apparatus and method for cleaning a substrate using pressurized fluid. One embodiment of the present invention comprises two rollers to support and rotate a substrate in a substantially vertical orientation, a pressure wheel to apply a force to engage the substrate with the two rollers, and a swinging nozzle configured to dispense a pressurized fluid towards the substrate. Embodiments of the present invention enable substrate cleaning using a pressurized fluid to remove residue of polishing solution and particles in trenches formed on the substrate. Configuration of the pressure wheel and two rollers enables effective rotation of substrate in a vertical position, which allows simplified substrate transfer. In one embodiment, a pressure sensor is used to monitor the force applied to the substrate by the pressure wheel to prevent damages to the substrate. In another embodiment, the two rollers are driven by one motor via a belt assembly.

Figure 1:
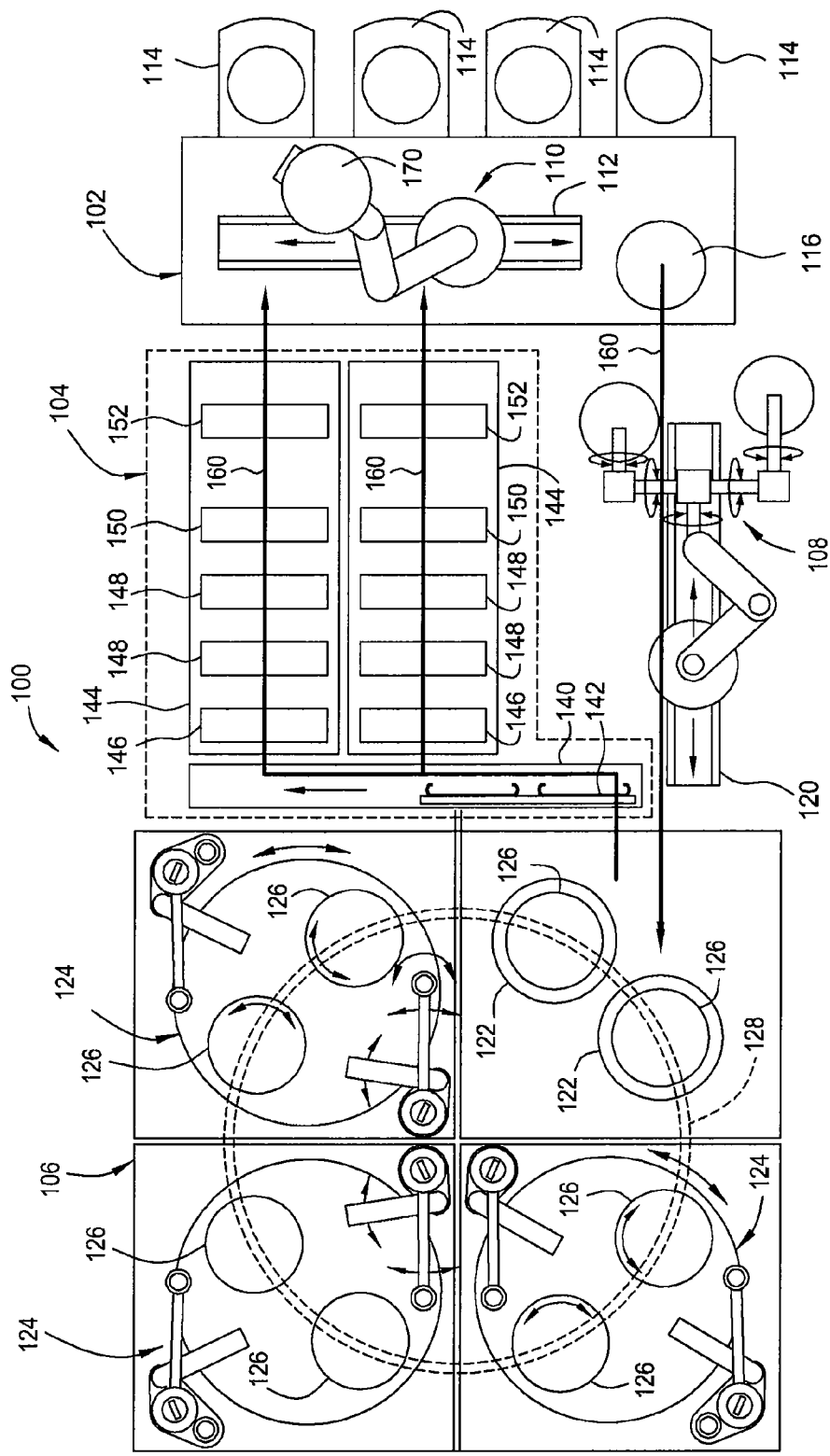
FIG. 1 is a schematic plan view of a polishing system in accordance with one embodiment of the present invention.

FIG. 1 is a schematic plan view of a polishing system 100 in accordance with one embodiment of the present invention. The polishing system 100 generally includes a factory interface 102, a cleaner module 104 and a polishing module 106. A wet robot 108 is provided to transfer substrates 170 between the factory interface 102 and the polishing module 106. The wet robot 108 may also be configured to transfer substrates between the polishing module 106 and the cleaner module 104. In one mode of operation, the flow of substrates, such as semiconductor wafers or other work piece, through the polishing system 100 is indicated by arrows 160.

The factory interface 102 generally includes a dry robot 110 which is configured to transfer substrates 170 among one or more cassettes 114 and one or more transfer platforms 116. In one embodiment, the dry robot 110 may be movable along a track 112.

The wet robot 108 generally is configured to retrieve the substrates 170 from the factory interface 102 in a face-up horizontal orientation, to flip the substrates 170 to a face-down horizontal orientation to the polishing module 106, and to rotate the substrates 170 to a vertical orientation to the cleaner module 104. In one embodiment, the wet robot 108 is mounted on a track 120 that facilitates linear translation of the wet robot 108.

The polishing module 106 generally comprises a plurality of polishing heads 126 configured to retain substrates 170, load cups 122 configured to receive the substrates 170 from the wet robot 108 and transfer the substrates 170 to the polishing heads 126, and two or more polishing stations 124 configured to polish the substrates 170 on the polishing heads 126.

In one embodiment, the polishing heads 126 are coupled to an overhead track 128. The overhead track 128 is configured to transfer the polishing heads 126 and to position the polishing heads 126 selectively over the polishing stations 124 and load cups 122. In the embodiment, the overhead track 128 has a circular configuration which allows the polishing heads 126 to be selectively rotated over and/or clear of the load cups 122 and the polishing stations 124. It is contemplated that the overhead track 128 may have other configurations including elliptical, oval, linear or other suitable orientation.

During processing, the substrates 170 are transferred from the cassette 114 to the transfer platform 116 by the dry robot 110. The substrates 170 are then picked up by the wet robot 108 and transferred to the load cups 122. Returning to FIG. 1, processed substrates are returned to the load cups 122 of the polishing module 106 for transfer by the wet robot 108 to the cleaner 104. The cleaner 104 generally includes a shuttle 140 and one or more cleaning modules 144. The shuttle 140 includes a transfer mechanism 142 which facilitates hand-off of the processed substrates from the wet robot 108 to the one or more cleaning modules 144.

The processed substrates are transferred from the shuttle 140 through of the one or more cleaning modules 144 by an overhead transfer mechanism (not shown). In the embodiment depicted in FIG. 1, two cleaning modules 144 are shown in an aligned, parallel arrangement. Each of the cleaning modules 144 generally include one or more megasonic cleaners, one or more brush boxes, one or more spray jet boxes and one or more dryers. In the embodiment depicted in FIG. 1, each of the cleaning modules 144 includes a megasonic cleaner 146, two brush box modules 148, a jet cleaner module 150 and a dryer 152. Dried substrates leaving the dryer 152 are rotated to a horizontal orientation for retrieval by the dry robot 110 which returns the dried substrates 170 to an empty slot in one of the wafer storage cassettes 144. One embodiment of a cleaning module that may be adapted to benefit from the invention is a DESCIA® cleaner, available from Applied Materials, Inc., located in Santa Clara, Calif.

In one embodiment, a transfer device (not shown) is used to retrieve and advance substrates 170 through the cleaning module 144 sequentially, from the megasonic cleaner 146 to the brush box module 148 then to the jet cleaner module 150 and the dryer 152. Each module 146, 148, 150 focuses on different cleaning function to achieve a specific cleaning effect.

The megasonic cleaner 146 is configured to perform an efficient cleaning step using megasonic energy. Embodiments of a megasonic cleaner may be found in U.S. Pat. No. 6,119,708, entitled "Method and Apparatus for Cleaning the Edge of a Think Disc".

The brush box module 148 is configured to perform a cleaning step using mechanical contact, such as scrubbing motion.

The dryer 152 is configured to quickly dry a substrate after cleaning to remove bath residue and prevent streaking, spotting caused by evaporation. Description of a dryer may be found in U.S. Pat. No. 6,516,816, entitled "Spin-Rinse-Dryer".

The jet cleaner module 150 is configured to perform a cleaning step using pressurized liquid. Exemplary embodiments of a jet cleaner module described in detail with FIGS. 2-4 of the present application.

In one embodiment, the jet cleaner module 150 is configured to clean a substrate positioned in a vertical orientation using a pressurized liquid stream. The pressurized liquid stream is configured for further cleaning after scrubbing, particularly removing particles or residues from structures, such as deep trenches, on a surface of the substrate being processed. The vertical orientation of the substrate in the jet cleaner module 150 reduces complexity of substrate transferring.

Figure 2:
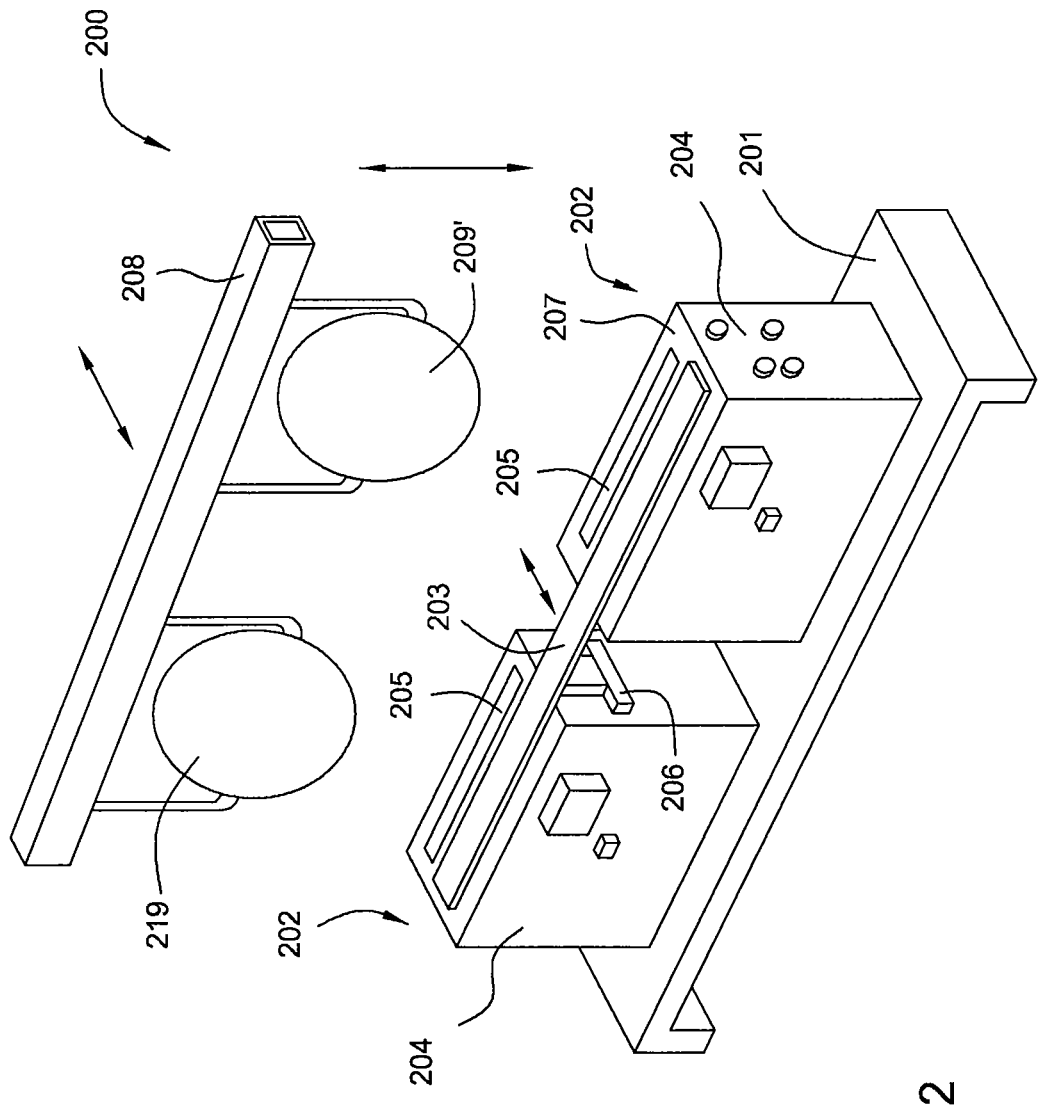
FIG. 2 is a schematic perspective view of a jet cleaner assembly in accordance with one embodiment of the present invention.

FIG. 2 is a schematic perspective view of a jet cleaner assembly 200 in accordance with one embodiment of the present invention. The jet cleaner assembly 200 comprises two jet cleaner modules 202 secured on a supporting frame 201. Each jet cleaner module 202 is configured to receive and clean a substrate in a vertical orientation. The jet cleaner assembly 200 may be used in a system configured to clean two substrates in a parallel manner, such as the cleaner module 104 of FIG. 1.

Each jet cleaner module 202 has an opening 205 formed on a top 207 of a body 204. The opening 205 is configured to allow passage of a substrate. During processing, a substrate handler 208 may transfer substrates 209 to the jet cleaner assembly 200, lower the substrates 209 into the jet cleaner modules 202 for cleaning, and pick up the cleaned substrates 209 from the jet cleaner modules 202.

During cleaning, the openings 205 may be closed by a sliding lid 203 to prevent cleaning solution from splashing out and prevent outside particles from entering the jet cleaner modules 202. In one embodiment, the sliding lid 203 is configured to cover the opening 205 of both jet cleaner modules 202. In one embodiment, an actuator 206 is coupled to the sliding lid 203 and configured to facilitate opening and closing of the openings 205.

Figure 3A:
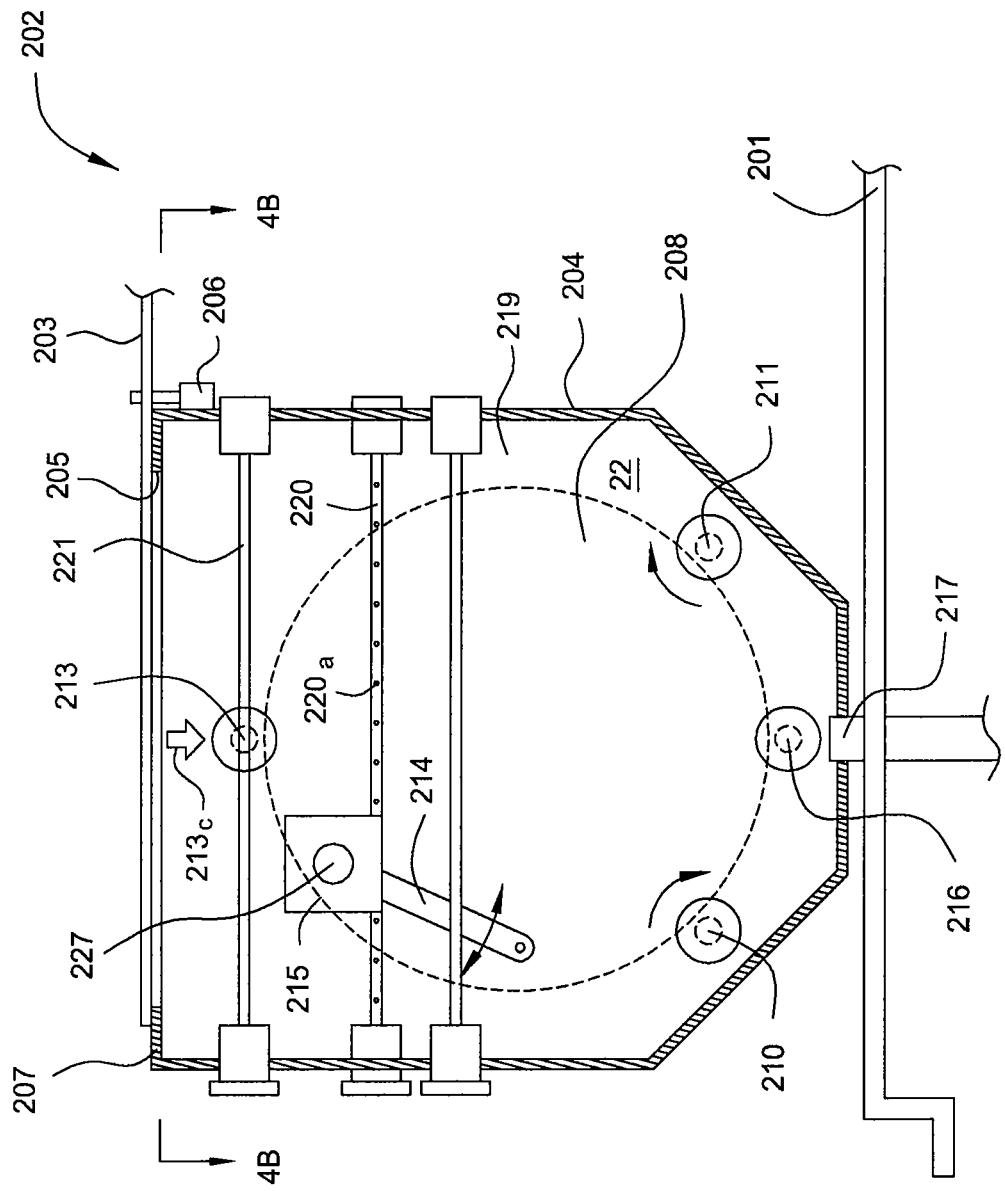
FIG. 3A is a schematic sectional side view of a jet cleaner in accordance with one embodiment of the present invention.
Figure 4A:
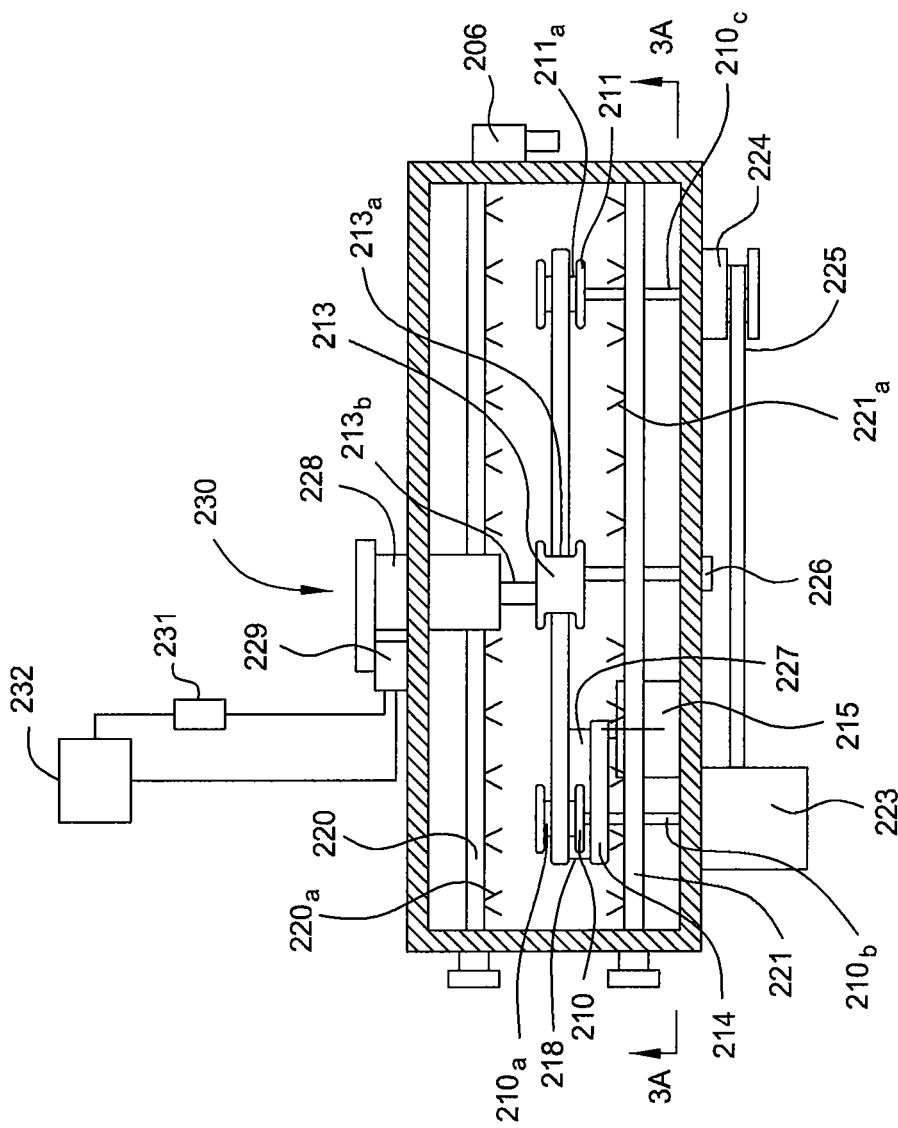
FIG. 4A is a schematic top view of the jet cleaner of FIG. 3A.

FIG. 3A is a schematic sectional side view of the jet cleaner module 202 in accordance with one embodiment of the present invention. FIG. 4A is a schematic top view of the jet cleaner module 202 of FIG. 3A.

The body 204 of the jet cleaner module 202 defines a processing volume 222 configured to retain and process a substrate 209 therein. The substrate 209 can enter and exit the processing volume 222 through the opening 205 of the top. An exhaust 217 is in fluid communication with the processing volume 222. The jet cleaner module 202 comprises two substrate rollers 210, 211 disposed in a lower portion of the processing volume 222. Each substrate roller 210, 211 has a recess 210a, 211a configured to receive the substrate 209 near an edge. In one embodiment, the substrate rollers 210, 211 are coupled to driving axis 210b, 211b respectively.

The driving axis 210b, 211b are coupled to driving mechanism to rotate the substrate rollers 210, 211. The driving axis 210b, 211b may be rotated by different motors or share the same motor. In one embodiment, the driving axis 210b is directly coupled to a motor 223 and the driving axis 211b is coupled with the motor 223 via a belt assembly 225 and a wheel 224. During processing, the substrate rollers 210, 211 rotate at substantially same rate and drive the substrate 209 to rotate through friction.

The jet cleaner module 202 further comprises a pressure wheel 213 configured to pressure the substrate 209 against the substrate rollers 210, 211 during processing. In one embodiment, the pressure wheel 213 is disposed on an upper portion of the processing volume 222. In one embodiment, the pressure wheel 213 has a recess 213a formed therein, as shown in FIG. 4A. The recess 213a is configured to receive the edge portion of the substrate 209.

During processing, the pressure wheel 213 moves radially inward, as shown by an arrow 213b, while the recess 213a of the pressure wheel 213 is aligned with the edge of the substrate 209. The pressure wheel 213 eventually contacts the edge portion of the substrate 209 and applies a pressure to the edge of the substrate 209. The pressure from the pressure wheel 213 increases friction between the substrate 209 and the substrate rollers 210, 211 so that the substrate 209 can be efficiently rotated during processing.

Figure 4B:
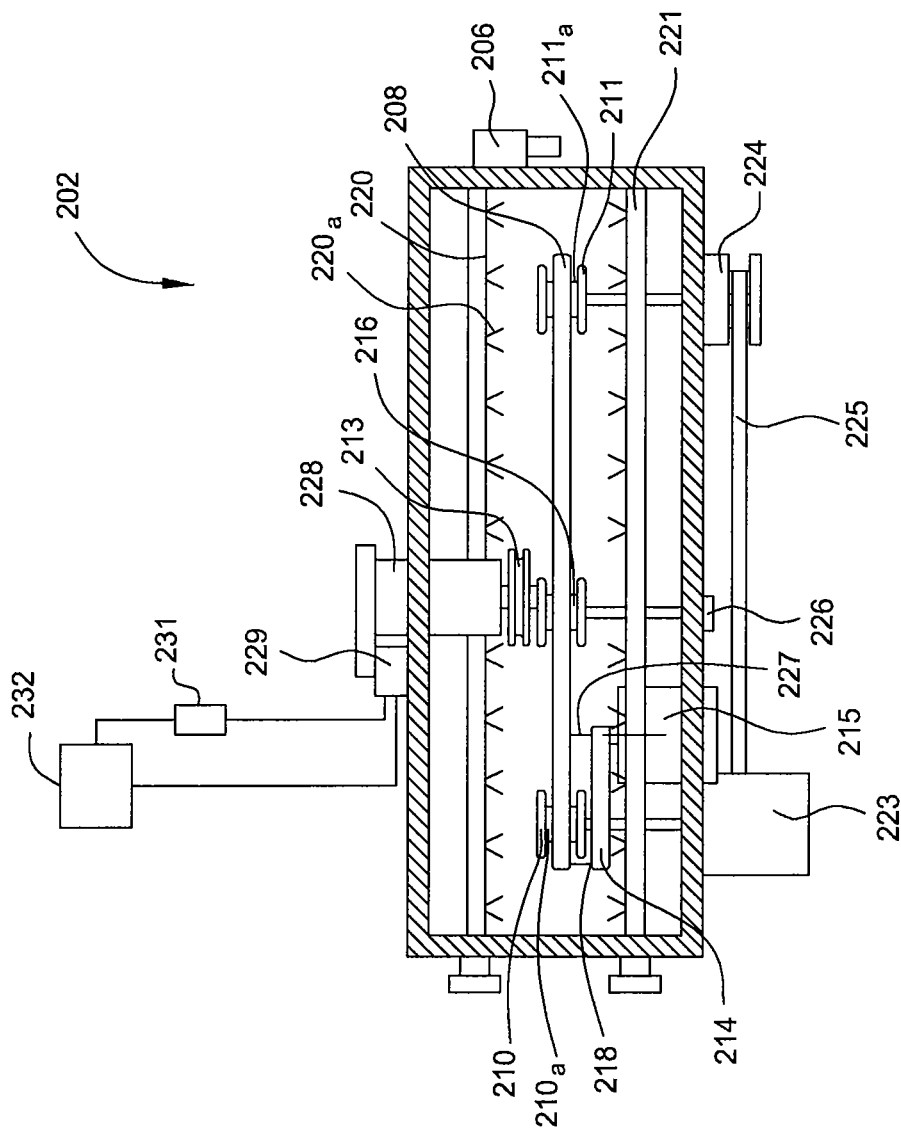
FIG. 4B is a schematic top view of the jet cleaner of FIG. 3A with the pressure wheel in a retracted position.

The pressure wheel 213 is connected to a motion mechanism 230, which may be disposed inside or outside the processing volume 222. In one embodiment, the motion mechanism 230 comprises an axial actuator 228 configured to extend or retract the pressure wheel 213. FIG. 4A is a schematic top view of the jet cleaner module 202 with the pressure wheel 213 in an extended position wherein the pressure wheel 213 is aligned with the substrate 209 and in position to apply a pressure to the substrate 209. FIG. 4B is a schematic top view of the jet cleaner module 202 with the pressure wheel 213 in a retracted position wherein the pressure wheel 213 is cleared from a vertical plane of the substrate 209 to allow the substrate 209 to enter or to exit the processing volume 222.

Figure 3B:
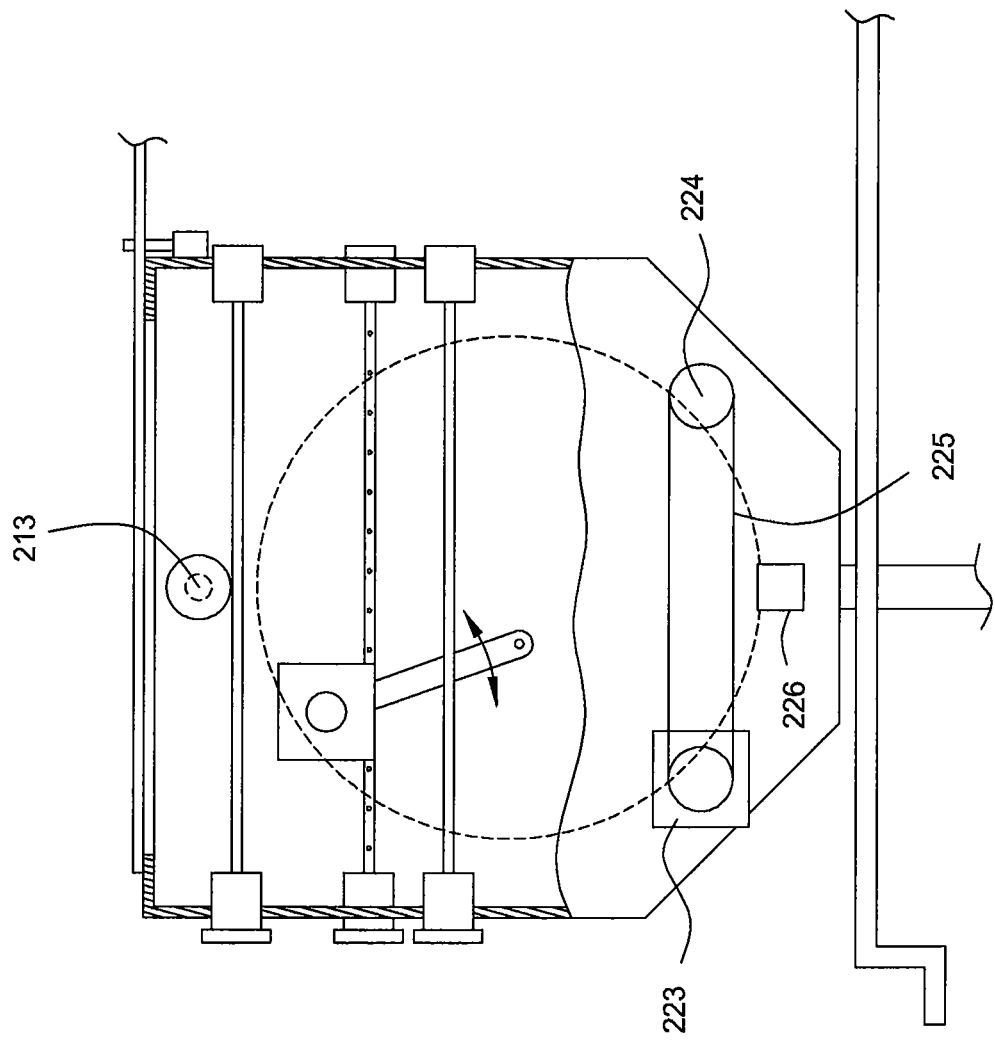
FIG. 3B is a schematic sectional side view of the jet cleaner of FIG. 3A with a pressure wheel in a released position.

The motion mechanism 230 further comprises a vertical actuator 229 configured to move the pressure wheel 213 and the axial actuator 228 vertically to apply a pressure to the substrate 209 or to release the substrate 209. FIG. 3A illustrates the pressure wheel 213 in a pressurizing position wherein the pressure wheel 213 contacts the substrate 209 and applies a vertical pressure the substrate 209. FIG. 3B is a schematic sectional side view of the jet cleaner module 202 of FIG. 3A with the pressure wheel 213 in a released position wherein the pressure wheel 213 is cleared from the substrate 209 and in position to retract by the axial actuator 228.

In one embodiment, the pressure is applied by lowering the pressure wheel 213 against the substrate 209 by the vertical actuator 229. To avoid damages to the substrate 209 and to ensure adequate force is applied to the substrate 209, a magnitude of the pressure applied to the substrate 209 by the pressure wheel 213 is monitored. In one embodiment, the magnitude of the pressure can be monitored by monitoring the vertical actuator 229. In one embodiment, one or more operating parameters of the vertical actuator 229 can be correlated to the magnitude of the pressure between the pressure wheel 213. In one embodiment, a sensor 231 is coupled to the vertical actuator 229 and a system controller 232. The system controller 232 subsequently sends control signals to the vertical actuator 229 according signals from the sensor 231.

In one embodiment, the vertical actuator 229 comprises a hydraulic cylinder, the sensor 231 is a pressure sensor, and the magnitude of the pressure applied to the substrate 209 can be monitored by measuring a hydraulic pressure of the hydraulic cylinder.

In one embodiment, the pressure wheel 213 is rotatable about an axis 213b. During processing, the pressure wheel 213 passively rotates about the axis 213b while applying a pressure to the rotating substrate 209. In one embodiment, a rotation sensor, such as an encoder, can be coupled to the pressure wheel 213, and the rotation rate of the substrate 209 can be measured by monitoring the rotation sensor coupled to the pressure wheel 213.

In another embodiment, the jet cleaner module 202 comprises a sensor wheel 216 disposed in a position to make contact with the substrate 209 during processing. The sensor wheel 216 is configured to rotate with the substrate 209 and to transfer the rotation rate of the substrate 209 to a rotation sensor 226. In one embodiment, the sensor wheel 216 is disposed in a lower portion of the processing volume 222 so that the substrate 209 rests on the sensor wheel 216. The rotation sensor 226 is further coupled with the system controller 232.

The jet cleaner module 202 further comprises a pivoting arm 214 disposed in the processing volume 222. One end of the pivoting arm 214 is coupled to a motor assembly 215 configured to pivot the pivoting arm 214 about a pivoting axis 227 so that the pivoting arm 214 moves in a plane substantially parallel to the substrate 209. A nozzle 218 is disposed on a distal end of the pivoting arm 214. The nozzle 218 is configured to direct a pressurized fluid towards the substrate 209 to dislodge particles or residues from the substrate 209, particularly from trench structures formed on a device side of the substrate 209. Pressure of the pressurized liquid dispensed from the nozzle may be adjusted to suit process requirement. The nozzle 218 may be configured to dispense DI water, or other cleaning solutions.

FIGS. 3A and 3B schematically illustrate two different positions of the pivoting arm 214. During processing, rotation of the substrate 209 and pivoting motion of the pivoting arm 214 assures that the nozzle 218 directs a pressurized fluid towards entire surface of the substrate 209. In one embodiment, the pivoting arm 214 is disposed near an upper portion of the processing volume 222.

The jet cleaner module 202 further comprises cleaning solution spraying bars 220, 221 disposed in the processing volume 222. In one embodiment, the cleaning solution spraying bars 220, 221 are disposed on opposite sides of the processing volume 222 and configured to direct cleaning solutions to both sides of the substrate 209. In one embodiment, the cleaning solution spraying bar 220, 221 has a plurality of nozzles 220*a*, 221*a* disposed lengthwise. The plurality of nozzles 220*a*, 221*a* are configured to direct cleaning solution towards the substrate 209. In one embodiment, the plurality of nozzles 220*a*, 221*a* are evenly distributed along the cleaning solution spray bar 220, 221 respectively. In one embodiment, the cleaning solution spraying bars 220, 221 are disposed in an upper portion of the processing volume 222.

The jet cleaner module 202 further comprises a water spraying bar 219 disposed above the cleaning solution spraying bars 220, 221. The water spraying bar 219 has a plurality of spraying nozzles (not shown) disposed along the length. In one embodiment, the water spraying bar 219 is configured to spray DI water towards the substrate 209 when the substrate 209 is being transferred into or out of the processing volume 222. In one embodiment, the water spraying bar 219 can be used to wet the substrate 209 prior to cleaning. In one embodiment, the water spraying bar 219 and the pivoting arm 214 are disposed on the same side of the substrate 209.

An exemplary cleaning process using the jet cleaner assembly 200 may be at follows. The sliding lid 203 slides back exposing the openings 205 of the jet cleaner module 202 and the pressure wheel 213 in each jet cleaner module 202 is in a retracted position. The substrate handler 208 transfers two substrates 209 over the openings 205, then lowers the substrate 209 into the processing volumes 222 with device sides of the substrates 209 facing the pivoting arm 214. The substrate handler 208 then exits the processing volume 222 and the sliding lid 203 moves to close the openings 205.

The water spraying bar 219 sprays water towards the substrate 209 to wet the substrate 209 in each jet cleaner module 202. The substrate rollers 210, 211 receive the substrate 209 and the substrate handler 208 exits the processing volumes 222. The pressure wheel 213 extends to align with the substrate 209. The pressure wheel 213 is then lowered to contact the substrate 209 and apply a pressure to the substrate 209. The pressure wheel 213 stops when a parameter of the vertical actuator 229 reaches a critical value. The substrate 209 is then cleaned as the solution spraying bars 219, 220 spray cleaning solution to both sides of the substrate 209 and the nozzle 218 directs pressurized cleaning fluid toward the substrates 209 while the pivoting arm 214 pivots about the axis 227 and the substrate 209 is rotated by the substrate rollers 210, 211.

After the substrate 209 is cleaned, the pressure wheel 213 raises to release the substrate 209 and then retracts to clear passage for the substrate 209. The sliding lid 203 moves to expose the openings 205 and the substrate handler 208 lowers into the processing volumes 222 to pick up the substrates 209.

While the foregoing is directed to embodiments of the present invention, other and further embodiments of the invention may be devised without departing from the basic scope thereof, and the scope thereof is determined by the claims that follow.

What is claimed is:

1. A substrate cleaner, comprising:
    a chamber body defining a processing volume configured to receive a substrate in a substantially vertical orientation;
    a driving mechanism configured to support the substrate in a substantially vertical orientation and to rotate the substrate;
    a first spraying bar disposed in the processing volume and coupled to the chamber body;
    a second spraying bar disposed in the processing volume and coupled to the chamber body, wherein each of the first and second spraying bars has a plurality of nozzles formed therein and a front side and a back side of the substrate respectively;
    a water spraying bar disposed in the processing volume above the first spraying bar and coupled to the chamber body, wherein the water spraying bar has a plurality of water nozzles formed therein and is configured to spray the substrate;
    a pivoting arm disposed in the processing volume and having a first end coupled to the chamber body, wherein the pivoting arm pivots within a plane parallel to the substrate, and wherein the plane is positioned between the first and second spraying bars;
    a pivot arm nozzle coupled to a second end of the pivoting arm, wherein the pivoting arm is configured to move the pivot arm nozzle within the plane, and wherein the pivot arm nozzle is configured to direct a pressurized fluid towards at least a center of the substrate.

2. The substrate cleaner of claim 1, further comprising a pivoting motor, wherein the first end of the pivoting arm is coupled to the pivoting motor, and wherein the pivoting motor is coupled to the chamber body.

3. The substrate cleaner of claim 2, further comprises a lid movably disposed on the chamber body, wherein the chamber body has a top opening configured to allow passage of the substrate, the lid is movable between a first position configured to expose the top opening to allow passage of the substrate and a second position configured to cover the top opening during processing.

4. The substrate cleaner of claim 2, wherein the driving mechanism comprises:
    two rollers disposed in the processing volume, wherein each of the rollers has a groove configured to receive an edge of the substrate, and the two rollers are configured to support the substrate in a substantially vertical orientation and to rotate the substrate; and
    a pressure wheel disposed in the processing volume, wherein the pressure wheel is configured to apply a force on the edge of the substrate to push the substrate against the two rollers.

5. The substrate cleaner of claim 4, further comprises a moving mechanism connected to the pressure wheel, wherein the moving mechanism comprises a location actuator to move the pressure wheel between a retracted position configured to clear a passage for the substrate and an extended position configured to retain the substrate among the pressure wheel and the two rollers.

6. The substrate cleaner of claim 5, wherein the moving mechanism further comprises an engaging actuator configured to move the pressure wheel in the extended position to push and release the substrate.

7. The substrate cleaner of claim 6, wherein the engaging actuator comprises:
    a linear cylinder; and
    a pressure sensor coupled to the linear cylinder, wherein the pressure sensor is configured to sense characteristics indicating a pressure applied to the substrate.

8. The substrate cleaner of claim 4, further comprising a rotation sensor coupled to the pressure wheel, wherein the rotation sensor is configured to measure a rotation rate of the substrate.

9. The substrate cleaner of claim 4, further comprising a drive motor coupled to both of the two rollers and configured to rotate the substrate by rotating the two rollers.

10. A substrate cleaner, comprising:
    a chamber body defining a processing volume configured to receive a substrate in a substantially vertical orientation;

a driving mechanism configured to support the substrate in a substantially vertical orientation and to rotate the substrate;

a first spraying bar disposed in the processing volume and coupled to the chamber body;

a second spraying bar disposed in the processing volume and coupled to the chamber body, wherein each of the first and second spraying bars has a plurality of nozzles operable to spray a front side and a back side of the substrate respectively;

a pivoting arm disposed in the processing volume and having a first end coupled to the chamber body, wherein the pivoting arm pivots is operable to move a pivot arm nozzle coupled to a second end of the pivoting arm over the substrate and between the first and second spraying bars wherein the pivot arm nozzle is operable to direct a pressurized fluid towards at least a center of the substrate.

11. The substrate cleaner of claim 10, further comprising a pivoting motor, wherein the first end of the pivoting arm is coupled to the pivoting motor, and wherein the pivoting motor is coupled to the chamber body.

12. The substrate cleaner of claim 11, wherein the driving mechanism comprises:

two rollers disposed in the processing volume, wherein each of the rollers has a groove configured to receive an edge of the substrate, and the two rollers are operable to support the substrate in a substantially vertical orientation and to rotate the substrate; and a pressure wheel disposed in the processing volume, wherein the pressure wheel is operable to apply a force on the edge of the substrate to push the substrate against the two rollers.

13. The substrate cleaner of claim 12, further comprises a moving mechanism connected to the pressure wheel, wherein the moving mechanism comprises a location actuator to move the pressure wheel between a retracted position configured to clear a passage for the substrate and an extended position configured to retain the substrate among the pressure wheel and the two rollers.

14. The substrate cleaner of claim 13, wherein the moving mechanism further comprises an engaging actuator configured to move the pressure wheel in the extended position to push and release the substrate.

15. The substrate cleaner of claim 14, wherein the engaging actuator comprises:

a linear cylinder; and a pressure sensor coupled to the linear cylinder, wherein the pressure sensor is operable to sense characteristics indicating a pressure applied to the substrate.

16. The substrate cleaner of claim 12, further comprising a rotation sensor coupled to the pressure wheel, wherein the rotation sensor is configured to measure a rotation rate of the substrate.

17. The substrate cleaner of claim 12, further comprising a drive motor coupled to both of the two rollers and operable to rotate the substrate by rotating the two rollers.

18. The substrate cleaner of claim 10, further comprises a lid movably disposed on the chamber body, wherein the chamber body has a top opening configured to allow passage of the substrate, the lid is movable between a first position configured to expose the top opening to allow passage of the substrate and a second position configured to cover the top opening during processing.

19. A substrate cleaner, comprising:

a chamber body defining a processing volume configured to receive a substrate in a substantially vertical orientation;

a driving mechanism operable to support the substrate in a substantially vertical orientation and to rotate the substrate;

a first spraying bar disposed in the processing volume and coupled to the chamber body;

a second spraying bar disposed in the processing volume and coupled to the chamber body, wherein each of the first and second spraying bars has a plurality of nozzles formed therein and are configured to spray a front side and a back side of the substrate respectively; and a pivoting arm disposed in the processing volume and having a first end coupled to the chamber body, wherein the pivoting arm pivots a pivot arm nozzle coupled to the pivot arm between the first and second spraying bars, wherein the pivot arm nozzle is operable to direct a pressurized fluid towards at least a center of the substrate in an unobstructed path between the pivot arm nozzle and at least the center of the substrate during cleaning.

20. The substrate cleaner of claim 19, further comprising:

a water spraying bar disposed in the processing volume above the first spraying bar and coupled to the chamber body, wherein the water spraying bar has a plurality of water nozzles formed therein and is configured to spray the substrate.

21. The substrate cleaner of claim 20, wherein the pivoting arm, first spraying bar, and the water spraying bar are disposed on the same side of the substrate.

* * * * *